United States Patent
Seo et al.

(10) Patent No.: US 11,340,305 B2
(45) Date of Patent: May 24, 2022

(54) APPARATUS AND METHOD FOR ESTIMATING STATE OF SECONDARY BATTERY

(71) Applicant: LG CHEM, LTD., Seoul (KR)

(72) Inventors: Se-Wook Seo, Daejeon (KR); Jin-Hyung Lim, Daejeon (KR); Cheol-Soo Lee, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 259 days.

(21) Appl. No.: 16/623,136

(22) PCT Filed: Jan. 25, 2019

(86) PCT No.: PCT/KR2019/001106
§ 371 (c)(1),
(2) Date: Dec. 16, 2019

(87) PCT Pub. No.: WO2019/156403
PCT Pub. Date: Aug. 15, 2019

(65) Prior Publication Data
US 2020/0174083 A1 Jun. 4, 2020

(30) Foreign Application Priority Data
Feb. 9, 2018 (KR) .......................... 10-2018-0016387

(51) Int. Cl.
*G01R 31/392* (2019.01)
*G01R 31/3835* (2019.01)
(Continued)

(52) U.S. Cl.
CPC ....... *G01R 31/392* (2019.01); *G01R 31/3835* (2019.01); *H01M 10/44* (2013.01);
(Continued)

(58) Field of Classification Search
None
See application file for complete search history.

(56) References Cited

U.S. PATENT DOCUMENTS

| 8,306,781 | B2 | 11/2012 | Xu et al. |
| 10,393,819 | B2 * | 8/2019 | You .................. G01R 31/392 |

(Continued)

FOREIGN PATENT DOCUMENTS

| CN | 101908770 A | 12/2010 |
| CN | 103033755 A | 4/2013 |

(Continued)

OTHER PUBLICATIONS

Office Action dated May 26, 2021, issued in corresponding Chinese Patent Application No. 201980003371.6.
(Continued)

*Primary Examiner* — Jas A Sanghera
(74) *Attorney, Agent, or Firm* — Morgan, Lewis & Bockius LLP (57) ABSTRACT

An apparatus for estimating a state of a secondary battery (SB), including: a charging unit electrically connected to two terminals of the SB, the charging unit charging the SB, a voltage measuring unit electrically connected to and measuring a voltage across the two terminals of the SB, a time measuring unit for: receiving a voltage value of the SB from the voltage measuring unit, and during charging of the SB, in a predefined voltage range, measuring a charge time of the SB corresponding to the voltage range multiple times, and a control unit for: transmitting/receiving an electrical signal to/from the charging unit, the voltage measuring unit, and the time measuring unit, calculating a ratio of a first charge time and a second charge time measured by the time measuring unit sequentially at a time interval, and estimating a state of the SB.

9 Claims, 6 Drawing Sheets

(51) Int. Cl.
    *H01M 10/44*      (2006.01)
    *H01M 10/46*      (2006.01)
    *H01M 10/48*      (2006.01)
    *H02J 7/00*      (2006.01)

(52) U.S. Cl.
    CPC .......... *H01M 10/46* (2013.01); *H01M 10/48* (2013.01); *H02J 7/0047* (2013.01)

(56) References Cited

U.S. PATENT DOCUMENTS

| | | |
|---|---|---|
| 2001/0022518 A1 | 9/2001 | Asakura et al. |
| 2003/0006735 A1 | 1/2003 | Kawakami et al. |
| 2003/0112011 A1 | 6/2003 | Guiheen et al. |
| 2007/0194756 A1* | 8/2007 | Cutrona ............ G01R 31/3835 320/132 |
| 2008/0120049 A1 | 5/2008 | Okumura et al. |
| 2012/0248876 A1 | 10/2012 | Tamura |
| 2013/0080096 A1 | 3/2013 | Toki |
| 2013/0085695 A1 | 4/2013 | Ono |
| 2015/0084639 A1 | 3/2015 | Joe |
| 2016/0003917 A1 | 1/2016 | You et al. |
| 2016/0187428 A1 | 6/2016 | Basu et al. |
| 2016/0202323 A1 | 7/2016 | Lee et al. |
| 2016/0214500 A1 | 7/2016 | Kim et al. |

FOREIGN PATENT DOCUMENTS

| | | |
|---|---|---|
| CN | 104541175 A | 4/2015 |
| CN | 106208168 A | 12/2016 |
| EP | 3032689 A1 | 6/2016 |
| JP | H11-052033 A | 2/1999 |
| JP | 2001-286064 A | 10/2001 |
| JP | 2001-292534 A | 10/2001 |
| JP | 2003-59544 A | 2/2003 |
| JP | 2004-193003 A | 7/2004 |
| JP | 2007-078506 A | 3/2007 |
| JP | 2010-252474 A | 11/2010 |
| JP | 2011-089938 A | 5/2011 |
| JP | 2011-257219 A | 12/2011 |
| JP | 2016-133513 A | 7/2016 |
| JP | 6115260 B2 | 4/2017 |
| KR | 2003-0048480 A | 6/2003 |
| KR | 10-2013-0039684 A | 4/2013 |
| KR | 10-2015-0005073 A | 1/2015 |
| KR | 10-1590375 B1 | 2/2016 |
| KR | 10-2016-0079637 A | 7/2016 |
| KR | 10-2018-0005345 A | 1/2018 |

OTHER PUBLICATIONS

Office Action dated Jan. 19, 2021, issued in corresponding Japanese Patent Application No. 2019-568735.
International Search Report dated May 10, 2019, issued in corresponding International Patent Application No. PCT/KR2019/001106.
Office Action dated Sep. 7, 2021, issued in corresponding Japanese Patent Application No. 2019-568735.

* cited by examiner

|  | BoL | 2 year | 4 year |
|---|---|---|---|
| First range(sec) | 4,611 | 3,349 | 3,050 |
| Second range(sec) | 263 | 376 | 440 |
| Total range(sec) | 4,874 | 3,725 | 3,490 |
| Ratio(%) | 100% | 76.43% | 71.60% |

APPARATUS AND METHOD FOR ESTIMATING STATE OF SECONDARY BATTERY

TECHNICAL FIELD

The present application claims priority to Korean Patent Application No. 10-2018-0016387 filed in the Republic of Korea on Feb. 9, 2018, the disclosure of which is incorporated herein by reference.

The present disclosure relates to an apparatus and method for estimating the state of a secondary battery, and more particularly, to a secondary battery state estimation apparatus and method for effectively estimating the lifetime or degradation of a secondary battery with secondary battery aging.

BACKGROUND ART

Recently, there is dramatically growing demand for portable electronic products such as laptop computers, video cameras and mobile phones, and with the intense development of electric vehicles, accumulators for energy storage, robots and satellites, many studies are being made on high performance secondary batteries that can be recharged repeatedly.

Currently, commercially available secondary batteries include nickel-cadmium batteries, nickel-hydrogen batteries, nickel-zinc batteries, lithium secondary batteries and the like, and among them, lithium secondary batteries have little or no memory effect, and thus they are gaining more attention than nickel-based secondary batteries for their advantages of free charging and discharging, a very low self-discharge rate and high energy density.

The lithium secondary battery mainly uses lithium-based oxide and a carbon material for a positive electrode active material and a negative electrode active material respectively. The lithium secondary battery includes an electrode assembly including a positive electrode plate and a negative electrode plate coated respectively with the positive electrode active material and the negative electrode active material with a separator interposed between, and a packaging material, i.e., a battery case hermetically sealed to receive the electrode assembly therein together with an electrolyte solution.

In general, lithium secondary batteries may be classified into can-type secondary batteries in which an electrode assembly is embedded in a metal can and pouch-type secondary batteries in which an electrode assembly is embedded in a pouch of an aluminum laminate sheet, according to the shape of the packaging material. These secondary batteries are usually manufactured by receiving the electrode assembly in the packaging material, and in this state, injecting an electrolyte solution, and sealing the packaging material.

More recently, with the extended application range of secondary batteries, secondary batteries are being widely used in small portable devices including smart phones, as well as medium- and large-scale devices such as electric vehicles including hybrid electric vehicles or energy storage systems.

In the case of a secondary battery, as the usage period increases, the performance degrades compared to initial state. Additionally, performance degradation estimation of the secondary battery is said to be State Of Health (SOH) estimation of the secondary battery, and the SOH of the secondary battery is an important factor in determining when to replace the secondary battery.

Additionally, the degradation level may differ in each secondary battery depending on environments in which the secondary battery is manufactured and used. Additionally, in the case of a battery pack including a plurality of secondary batteries, it is necessary to accurately estimate the lifetime of each secondary battery based on the degradation level of each secondary battery. Typically, a Battery Management System (BMS) is required to accurately estimate the lifetime of each secondary battery provided in the battery pack, and based on this, efficiently operate the battery pack.

DISCLOSURE

Technical Problem

The present disclosure is devised under the background of the conventional art, and therefore the present disclosure relates to an improved secondary battery state estimation apparatus and method for effectively estimating the lifetime or degradation of a secondary battery with secondary battery aging.

These and other objects and advantages of the present disclosure can be understood by the following description and will be apparent from the embodiments of the present disclosure. Additionally, it will be readily understood that the objects and advantages of the present disclosure are realized by the means set forth in the appended claims and combinations thereof.

Technical Solution

To achieve the above-described object, an apparatus for estimating a state of a secondary battery according to an embodiment of the present disclosure includes a charging unit electrically connected to two terminals of the secondary battery to charge the secondary battery, a voltage measuring unit electrically connected to the two terminals of the secondary battery to measure a voltage across the two terminals of the secondary battery, a time measuring unit configured to receive a voltage value of the secondary battery from the voltage measuring unit, and during charging of the secondary battery, in a predefined voltage range, measure a charge time of the secondary battery corresponding to the voltage range multiple times, and a control unit configured to transmit and receive an electrical signal to/from the charging unit, the voltage measuring unit and the time measuring unit, calculate a ratio of a first charge time and a second charge time measured by the time measuring unit sequentially at a time interval and estimate a state of the secondary battery.

Additionally, the voltage measuring unit may measure the voltage across the two terminals of the secondary battery when a charge current is continuously supplied from the charging unit to the secondary battery.

Additionally, the apparatus for estimating a state of a secondary battery according to an embodiment of the present disclosure may further include a memory unit configured to pre-store a degradation level of the secondary battery corresponding to the ratio of the second charge time to the first charge time.

Additionally, the apparatus for estimating a state of a secondary battery according to an embodiment of the present disclosure may further include an alarm unit configured to receive an electrical signal from the control unit, and transmit an alarm signal including information associated with a degradation level of the secondary battery to an external device based on the signal received from the control unit.

Additionally, the voltage range may include a first voltage range in which a constant charge current is maintained and a second voltage range in which a constant charge voltage is maintained, and the time measuring unit may be configured to measure the charge time of the secondary battery corresponding to each of the first voltage range and the second voltage range.

Additionally, the control unit may be configured to calculate a ratio of a plurality of charge times measured at a time interval in the first voltage range or a plurality of charge times measured at a time interval in the second voltage range.

Additionally, the control unit may be configured to set a charge time at a point of product sale of the secondary battery as the first charge time and a charge time measured at a time interval from the first charge time as the second charge time, and calculate a ratio of the second charge time to the first charge time.

Additionally, the control unit may be configured to transmit a replacement signal for the secondary battery when a ratio of the second charge time to the first charge time is a predetermined value or less.

Additionally, a battery pack according to an embodiment of the present disclosure includes the apparatus for estimating a state of a secondary battery according to the present disclosure.

Additionally, to achieve the above-described object, a method for estimating a state of a secondary battery according to an embodiment of the present disclosure includes charging the secondary battery, measuring a voltage across two terminals of the secondary battery, receiving a voltage value of the secondary battery, and during charging of the secondary battery, in a predefined voltage range, measuring a charge time of the secondary battery corresponding to the voltage range multiple times, and for a first charge time and a second charge time measured sequentially at a time interval, calculating a ratio of the second charge time to the first charge time and estimating a state of the secondary battery.

Advantageous Effects

According to an aspect of the present disclosure, the apparatus for estimating the state of a secondary battery measures the charge time of the secondary battery and uses a ratio between a plurality of charge times to estimate the degradation level of the secondary battery, thereby estimating the degradation level of the secondary battery in an easy and simple manner.

Particularly, as opposed to the conventional art considering the absolute charge time, the apparatus for estimating the state of a secondary battery according to an aspect of the present disclosure may use a ratio of charge time. The conventional art considering the absolute charge time is difficult to accurately estimate the state of a secondary battery due to process deviations in the manufacture of the secondary battery. Accordingly, the apparatus for estimating the state of a secondary battery according to the present disclosure may accurately estimate the degradation level of the secondary battery using a ratio of charge time.

The present disclosure may have a variety of other effects, and these and other effects of the present disclosure can be understood by the following description and will be apparent from the embodiments of the present disclosure.

BRIEF DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

MODE FOR DISCLOSURE

Hereinafter, the preferred embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

Unless the context clearly indicates otherwise, it will be understood that the term "comprises" or "includes" when used in this specification, specifies the presence of stated elements, but does not preclude the presence or addition of one or more other elements. Additionally, the term 'control unit' as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

In the specification, a secondary battery refers to a physically separable independent secondary battery including a negative terminal and a positive terminal. For example, a pouch-type lithium polymer cell may be regarded as a secondary battery.

Figure 1:
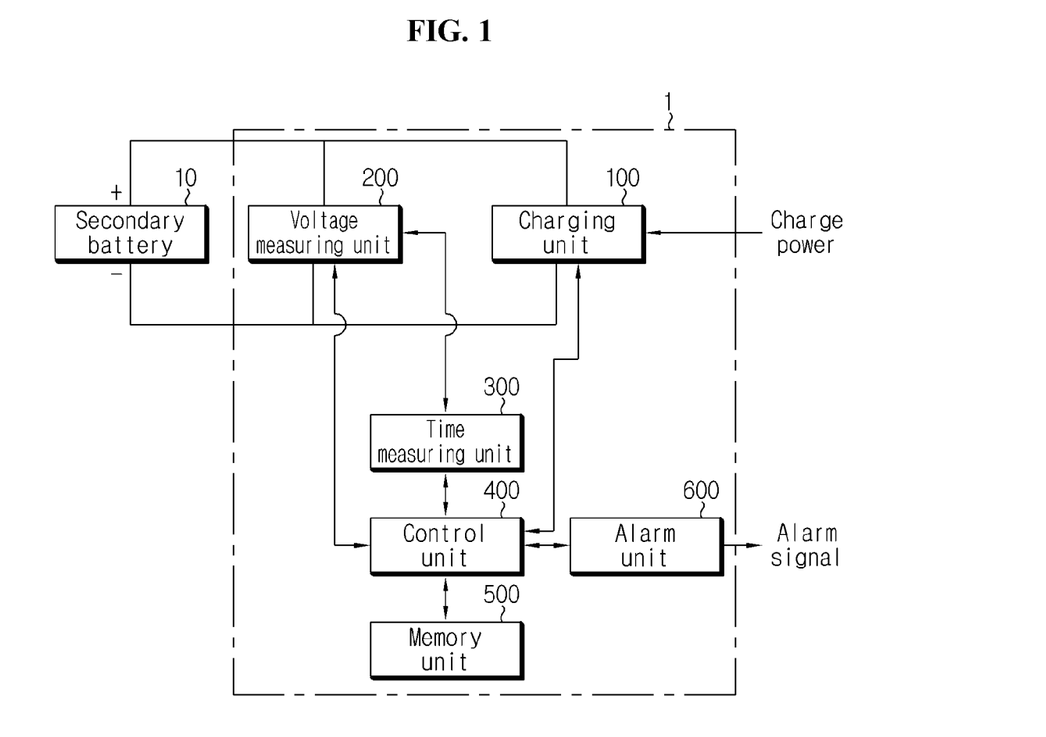
FIG. 1 is a schematic diagram showing the functional configuration of an apparatus for estimating the state of a secondary battery according to an embodiment of the present disclosure and connection with the secondary battery.

FIG. 1 is a schematic diagram showing the functional configuration of an apparatus for estimating the state of a secondary battery according to an embodiment of the present disclosure and connection with the secondary battery.

Referring to FIG. 1, the apparatus 1 for estimating the state of a secondary battery according to the present disclosure includes a charging unit 100, a voltage measuring unit 200, a time measuring unit 300 and a control unit 400.

The charging unit 100 may be electrically connected to two terminals of the secondary battery 10. Particularly, the charging unit 100 according to the present disclosure may be electrically connected to two terminals of the secondary battery 10 to supply the charge power to the secondary battery 10. For example, as shown in the configuration of FIG. 1, the charging unit 100 may be electrically connected to each of the positive terminal and the negative terminal of the secondary battery 10 to supply the charge power to the secondary battery 10.

The charging unit 100 may charge the secondary battery 10. Particularly, when the voltage of the secondary battery 10 corresponds to a predefined voltage, the charging unit 100 may start charging the secondary battery 10. Additionally, when the voltage of the secondary battery 10 corresponds to a predefined voltage, the charging unit 100 may terminate the charging of the secondary battery 10. In more detail, the charging unit 100 may charge the secondary battery 10 from a predetermined charge start voltage until the voltage of the secondary battery 10 reaches a predetermined charge end voltage.

The charging unit 100 according to an embodiment of the present disclosure may be provided in a hybrid electric vehicle or an electric vehicle, and may be supplied with charge power from the hybrid electric vehicle or the electric vehicle.

The charging unit 100 according to another embodiment of the present disclosure may be provided in a secondary battery test apparatus, and may be supplied with charge power from an external power source.

The voltage measuring unit 200 may be electrically connected to the two terminals of the secondary battery 10. Additionally, the voltage measuring unit 200 according to the present disclosure may measure the voltage across the two terminals of the secondary battery 10.

Preferably, the voltage measuring unit 200 according to the present disclosure may measure the voltage across the two terminals of the secondary battery 10 when the charge/discharge current continuously flows in or out of the secondary battery 10. Particularly, the voltage measuring unit 200 may measure the voltage across the two terminals of the secondary battery 10 when the charge current is continuously supplied from the charging unit 100 to the secondary battery 10. For example, the voltage measuring unit 200 may measure the voltage across the two terminals of the secondary battery 10 while the hybrid electric vehicle or the electric vehicle is driving.

The time measuring unit 300 may measure the charge time of the secondary battery 10. Particularly, the time measuring unit 300 may measure the charge time of the secondary battery 10 multiple times sequentially at a time interval. Additionally, the time measuring unit 300 may be electrically connected to the voltage measuring unit 200 to transmit and receive an electrical signal to/from the voltage measuring unit 200. Here, the time measuring unit 300 may receive a voltage value of the secondary battery 10 from the voltage measuring unit 200.

Additionally, the time measuring unit 300 may measure the charge time of the secondary battery 10 in a predefined voltage range during charging of the secondary battery 10. In more detail, during charging of the secondary battery 10, in a predefined voltage range between the charge start voltage and the charge end voltage, the time measuring unit 300 may be configured to measure the charge time of the secondary battery 10 corresponding to the voltage range multiple times.

The control unit 400 may be configured to estimate the state of the secondary battery 10. Additionally, the control unit 400 may be electrically connected to each of the charging unit 100, the voltage measuring unit 200 and the time measuring unit 300 to transmit and receive an electrical signal to/from the charging unit 100, the voltage measuring unit 200 and the time measuring unit 300.

Additionally, the control unit 400 may calculate a ratio of charge time. Particularly, the control unit 400 may calculate a ratio of a plurality of charge times measured sequentially at a time interval. In more detail, the control unit 400 may calculate a ratio of a first charge time and a second charge time measured by the time measuring unit 300 sequentially at a time interval. To this end, the control unit 400 may receive the plurality of charge times from the time measuring unit 300. In more detail, the control unit 400 may receive the first charge time and the second charge time from the time measuring unit 300.

The control unit 400 may estimate the state of the secondary battery 10 using the calculated ratio of charge time. Its detailed description will be provided below. Meanwhile, to perform the above-described operation, the control unit 400 may selectively include a processor, an Application-Specific Integrated Circuit (ASIC), a chipset, a logic circuit, register, a communication modem and/or a data processing device, known in the art.

Preferably, the apparatus 1 for estimating the state of a secondary battery according to an embodiment of the present disclosure may further include a memory unit 500.

The memory unit 500 may pre-store the degradation level of the secondary battery 10. Particularly, the memory unit 500 may pre-store the degradation level of the secondary battery 10 corresponding to the ratio of charge time. In more detail, the memory unit 500 may pre-store the degradation level of the secondary battery 10 corresponding to a ratio of the second charge time to the first charge time sequentially measured at a time interval.

Additionally, the memory unit 500 is not limited to a particular type, and includes any type of storage medium that can record and erase information. For example, the memory unit 500 may be RAM, ROM, register, hard disk, an optical recording medium or a magnetic recording medium. Additionally, the memory unit 500 may be electrically connected to the control unit 400 through, for example, a data bus, to allow the control unit 400 to access. Additionally, the memory unit 500 may store and/or update and/or erase and/or transmit programs including various control logics executed by the control unit 400, and/or data generated when the control logics are executed.

Additionally, preferably, the apparatus 1 for estimating the state of a secondary battery according to an embodiment of the present disclosure may further include an alarm unit 600.

The alarm unit 600 may transmit an alarm signal. For example, the alarm unit 600 may transmit the alarm signal to an external device or a vehicle. Additionally, the alarm unit 600 may receive an electrical signal from the control unit 400. Here, the control unit 400 may transmit a control signal to the alarm unit 600 to allow the alarm unit 600 to transmit the alarm signal. In more detail, the alarm unit 600 may transmit the alarm signal including information associated with the degradation level of the secondary battery 10 to the external device based on the signal received from the control unit 400. For example, the alarm unit 600 may transmit a replacement signal including information about the secondary battery 10 that has degraded and needs to be replaced.

Figure 2:
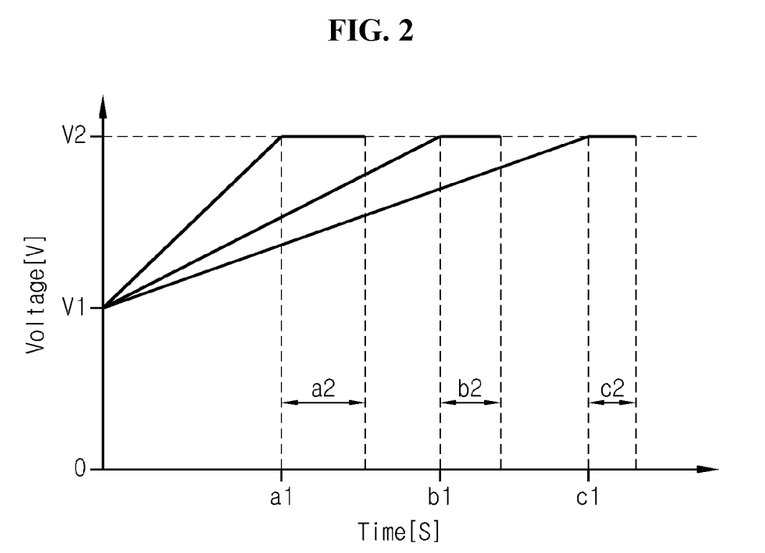
FIG. 2 shows a change in charge time based on the degradation level of a secondary battery connected to an apparatus for estimating the state of a secondary battery according to an embodiment of the present disclosure.

FIG. 2 shows a change in charge time based on the degradation level of the secondary battery connected to the apparatus for estimating the state of a secondary battery according to an embodiment of the present disclosure.

Referring to FIG. 2, the secondary battery 10 connected to the apparatus 1 for estimating the state of a secondary battery according to an embodiment of the present disclosure may be charged in a preset voltage range. That is, when the voltage of the secondary battery 10 corresponds to a preset charge start voltage, the charging unit 100 according to the present disclosure may charge the secondary battery 10. For example, as shown in the graph of FIG. 2, when the voltage of the secondary battery 10 corresponds to V1, the charging unit 100 may charge the secondary battery 10.

Additionally, when the voltage of the secondary battery 10 reaches a preset charge end voltage, the charging unit 100 may terminate the charging of the secondary battery 10. For example, as shown in the graph of FIG. 2, when the voltage of the secondary battery 10 reaches V2, the charging unit 100 may terminate the charging of the secondary battery 10.

The apparatus 1 for estimating the state of a secondary battery according to an embodiment of the present disclosure may estimate the state of the secondary battery 10 at a time interval. That is, the apparatus 1 for estimating the state of a secondary battery may measure the charge time of the secondary battery 10 sequentially at a time interval, and estimate the state of the secondary battery 10 using the measured charge times.

Additionally, the time measuring unit 300 may measure the charge time corresponding to the predefined voltage range between the charge start voltage and the charge end voltage multiple times. For example, as shown in the graph of FIG. 2, the time measuring unit 300 may measure the charge time multiple times in the voltage range between V1 and V2. In the embodiment of FIG. 2, the time measuring unit 300 may measure a plurality of charge times corresponding to a1, b1 and c1. For example, the control unit 400 may receive the plurality of charge times from the time measuring unit 300, and estimate the degradation level of the secondary battery 10 according to the charge times. For example, as the charge time is shorter, the degradation level of the secondary battery 10 may increase. That is, the degradation level of the secondary battery 10 shown in the graph of FIG. 2 gradually increases in the order of c1, b1 and a1. That is, when the charge time is measured at a time interval for one secondary battery 10, the charge times decrease in the order of c1, b1 and a1.

The secondary battery 10 connected to the apparatus 1 for estimating the state of a secondary battery according to an embodiment of the present disclosure may be charged in a preset voltage range. Here, the voltage range may include a first voltage range in which a constant charge current is maintained, and a second voltage range in which a constant charge voltage is maintained. Here, the time measuring unit 300 may measure the charge time of the secondary battery 10 corresponding to each of the first voltage range and the second voltage range.

Because the internal resistance increases with aging of the secondary battery 10, as the secondary battery 10 degrades, there is a reduction in the charge time of the first voltage range in which a constant charge current is maintained, and there is an increase in the charge time of the second voltage range in which a constant charge voltage is maintained. However, the total charge time including the first voltage range and the second voltage range is shorter as the secondary battery 10 degrades.

For example, in the voltage-time graph shown in FIG. 2, when the charge time of the voltage range V1~V2 corresponds to a1, a range in which the charge time is 0~a1 may correspond to the first voltage range in which a constant charge current is maintained. Additionally, a range in which the charge time is a2 may correspond to the second voltage range in which a constant charge voltage is maintained. For example, as the degradation level of the secondary battery 10 increases, the charge time of the first voltage range decreases in the order of c1, b1 and a1, and the charge time of the second voltage range increases in the order of c2, b2 and a2. However, the total charge time including the first voltage range and the second voltage range decreases in the order of c1+c2, b1+b2 and a1+a2.

Preferably, the control unit 400 according to an embodiment of the present disclosure may calculate a ratio of a plurality of charge times measured at a time interval in a predefined voltage range. In more detail, the control unit 400 may calculate a ratio of a plurality of charge times measured at a time interval in the first voltage range. Alternatively, the control unit 400 may calculate a ratio of a plurality of charge times measured at a time interval in the second voltage range. For example, in the embodiment of FIG. 2, the control unit 400 may calculate a ratio of a1, b1 and c1 measured at a time interval in the first voltage range. Additionally, the control unit 400 may calculate a ratio of a2, b2 and c2 measured at a time interval in the second voltage range.

Additionally, preferably, the control unit 400 according to an embodiment of the present disclosure may set the charge time at the point of product sale of the secondary battery 10 as the first charge time and the charge time measured at a time interval from the first charge time as the second charge time, and calculate a ratio of the second charge time to the first charge time. Here, the charge time at the point of product sale of the secondary battery 10 may refer to the charge time of the secondary battery 10 at Beginning Of Life (BOL). For example, in the embodiment of FIG. 2, the control unit 400 may set c1 as the first charge time, and b1 or a1 as the second charge time. Additionally, the control unit 400 may calculate a ratio of b1 to c1 or a ratio of a1 to c1. Alternatively, the control unit 400 may set c2 as the first charge time, and b2 or a2 as the second charge time. Additionally, the control unit 400 may calculate a ratio of b2 to c2 or a ratio of a2 to c2.

According to this configuration of the present disclosure, the apparatus for estimating the state of a secondary battery according to the present disclosure may estimate the state of the secondary battery quickly by comparing the charge times of a preset voltage range.

Additionally, the apparatus 1 for estimating the state of a secondary battery according to an embodiment of the present disclosure does not uniformly apply the first charge time as a specific value, and may measure the charge time at the initial state (the state at the point of product sale) for each secondary battery 10, and determine the first charge time of each secondary battery 10. That is, because the initial state (the state at the point of product sale) of the secondary battery 10 may differ due to a resistance deviation or a capacity deviation, the apparatus 1 for estimating the state of a secondary battery according to an embodiment of the present disclosure may estimate the current state of each secondary battery 10 more accurately than when the specific value is uniformly applied as the first charge time of the secondary battery 10.

Figure 3:
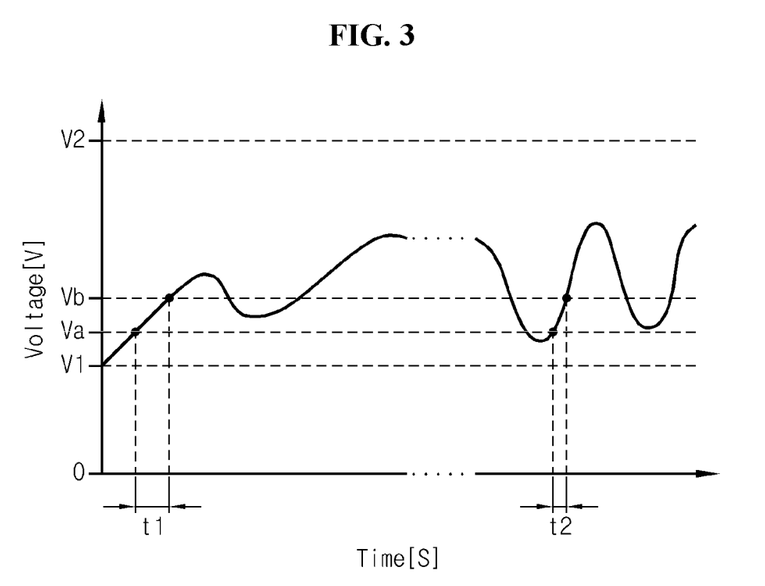
FIG. 3 shows a change in charge time based on the degradation level of a secondary battery connected to an apparatus for estimating the state of a secondary battery according to another embodiment of the present disclosure.

FIG. 3 shows a change in charge time based on the degradation level of the secondary battery connected to the apparatus for estimating the state of a secondary battery according to another embodiment of the present disclosure.

Referring to FIG. 3, the secondary battery 10 connected to the apparatus 1 for estimating the state of a secondary battery according to the present disclosure may be charged and discharged in a preset voltage range. For example, when a hybrid electric vehicle or an electric vehicle drives, the secondary battery 10 connected to the apparatus 1 for estimating the state of a secondary battery may be charged and discharged.

The graph shown in FIG. 3 shows two measurement times measured at a time interval while the secondary battery 10 is charged and discharged in a preset voltage range V1~V2. Here, assume that the measurement time t1 and the measurement time t2 are measured at a considerable time interval. For example, there may be a one year time interval between the measurement time t1 and the measurement time t2.

Here, the time measuring unit 300 may measure the charge time of the secondary battery 10 in the voltage range Va~Vb corresponding to a predefined voltage range. In more detail, in the voltage range Va~Vb, the time measuring unit 300 may measure t1, and measure t2 at a time interval from t1. In this configuration, the control unit 400 may calculate a ratio of t2 to t1, and estimate the degradation level of the secondary battery 10 using the calculated ratio. That is, the control unit 400 may estimate the degradation level of the secondary battery 10 according to the ratio of t1 to t2 based on the degradation level pre-stored in the memory unit 500.

Figure 4:
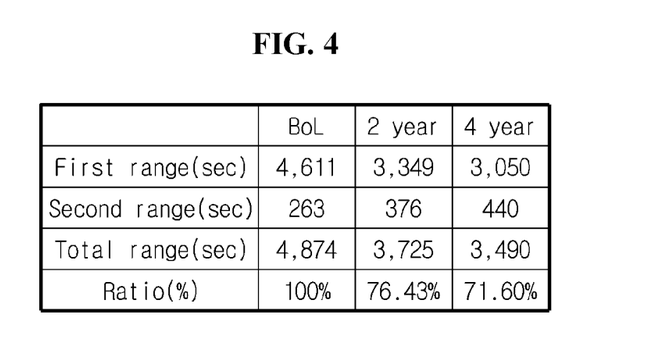
FIG. 4 shows a change in charge time and a change in ratio of charge time of a secondary battery according to an embodiment of the present disclosure.

FIG. 4 shows a change in charge time and a change in ratio of charge time of the secondary battery according to an embodiment of the present disclosure.

As shown in FIG. 4, the memory unit 500 according to an embodiment of the present disclosure may pre-store the degradation level of the secondary battery 10 corresponding to the ratio of charge time. In this instance, the memory unit 500 may store the plurality of charge times received from the time measuring unit 300.

Referring to FIGS. 1 and 4, the memory unit 500 may store the charge time corresponding to the voltage range and the ratio of charge time. For example, the BOL charge time of the secondary battery 10 may be 4,611 s in the first range, and 263 s in the second range. Here, the charge time of the total range including the first range and the second range may be 4,874 s. Additionally, the charge time after two year use of the secondary battery 10 may be 3,349 s in the first range, and 376 s in the second range. Here, the charge time of the total range including the first range and the second range may be 3,725 s. Additionally, the charge time after four year use of the secondary battery 10 may be 3,050 s in the first range, and 440 s in the second range. Here, the charge time of the total range including the first range and the second range may be 3,490 s.

The control unit 400 may receive the charge time of the voltage range from the memory unit 500, and calculate a ratio of charge time. For example, in the embodiment of FIG. 4, when the BOL charge time of the secondary battery 10 is set to 100%, the charge time after two year use of the secondary battery 10 to the BOL charge time of the secondary battery 10 may be 76.43%, and the charge time after four year use of the secondary battery 10 to the BOL charge time of the secondary battery 10 may be 71.60%. The control unit 400 may calculate a ratio of charge time for the first range and a ratio of charge time for the second range. Alternatively, the control unit 400 may calculate a ratio of charge time for the total range.

Preferably, the control unit 400 may determine whether the secondary battery 10 needs to be replaced. Particularly, when a ratio of charge time is a predetermined value or less, the control unit 400 may determine that the secondary battery 10 needs to be replaced. In more detail, when a ratio of the second charge time to the first charge time is a predetermined value or less, the control unit 400 may be configured to transmit a replacement signal for the secondary battery 10. For example, when a ratio of the charge time to the BOL charge time of the secondary battery 10 corresponds to 75%, the control unit 400 may determine that the secondary battery 10 needs to be replaced.

Here, the predetermined value may be differently determined for each secondary battery 10. That is, the predetermined value may be a value that is set independently for each secondary battery 10 based on the initial state of the secondary battery 10. For example, because the predetermined value is different for each secondary battery 10, even though a ratio of the second charge time to the first charge time of the first secondary battery is equal to a ratio of the second charge time to the first charge time of the second secondary battery, a replacement signal for only the first secondary battery may be transmitted.

Describing as a specific example, in the case of emergency call application, it is necessary to supply a specific power to prepare for an emergent situation. Accordingly, the secondary battery 10 used in emergency call application should always have the discharge capacity enough to supply the specific power. However, because the initial state may be different for each secondary battery 10 depending on the initial capacity and the resistance deviation of the secondary battery 10, the predetermined value may be determined for each secondary battery 10 based on a correlation between the discharge capacity (retained capacity) and the charge time of each secondary battery 10. For example, the predetermined value for the first secondary battery may be 75%, the predetermined value for the second secondary battery may be 78%, and the predetermined value for the third secondary battery may be 76%. In this instance, if it is assumed that the ratios of the second charge time to the first charge time of the first to third secondary batteries are all 76%, the control unit 400 may determine that the second secondary battery and the third secondary battery need to be replaced, and transmit a replacement signal for the second secondary battery and the third secondary battery. That is, the apparatus 1 for estimating the state of a secondary battery according to an embodiment of the present disclosure individually determines a reference ratio (a predetermined value) for determining whether the secondary battery 10 needs to be replaced based on the initial state of each secondary battery 10, to measure the state of each secondary battery 10 more precisely and accurately.

Additionally, the apparatus 1 for estimating the state of a secondary battery according to an embodiment of the present disclosure determines the state of each secondary battery 10 using the absolute time as well as the ratio of charge time. That is, because the apparatus 1 for estimating the state of a secondary battery uses the ratio of charge time of each secondary battery 10, it is possible to determine the state of each secondary battery 10 irrespective of a difference in resistance or capacity between the secondary batteries 10. For example, when the state of the secondary battery 10 is uniformly determined according to the absolute charge time of the secondary battery 10, because a difference in resistance or capacity between the secondary batteries 10 is not taken into account, the degradation level of each secondary battery 10 cannot be accurately measured. That is, even though the charge time is the same, the degradation level may be different depending on the resistance or capacity of the secondary battery 10. Accordingly, when only the absolute charge time is taken into account, it is impossible to accurately measure the state of the secondary battery 10, and thus the apparatus 1 for estimating the state of a secondary battery may measure the state of each secondary battery 10 more accurately than when only the absolute charge time is used.

The apparatus 1 for estimating the state of a secondary battery according to the present disclosure may be provided in a battery pack in itself. That is, the battery pack according to the present disclosure may include the above-described apparatus for estimating the state of a secondary battery according to the present disclosure. Here, the battery pack may include a plurality of secondary batteries, the apparatus for estimating the state of a secondary battery, an electrical component (a BMS, a relay, a fuse, etc.) and a case.

Figure 5:
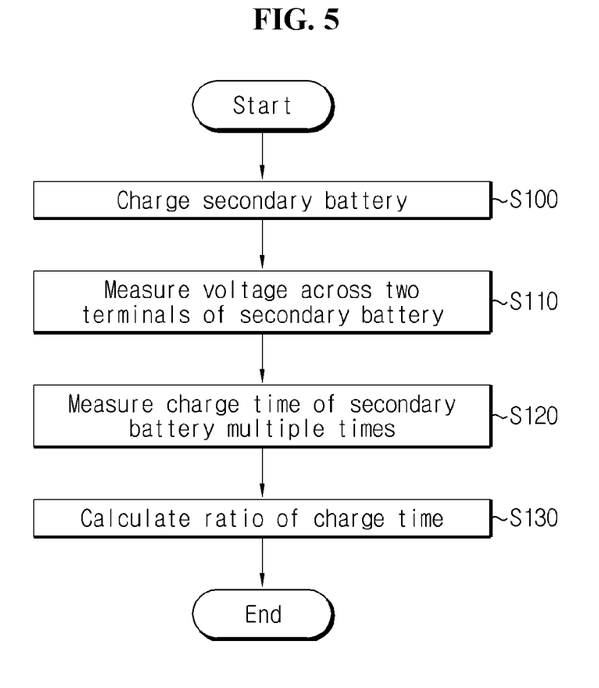
FIG. 5 is a schematic flowchart showing a method for estimating the state of a secondary battery according to an embodiment of the present disclosure.

FIG. 5 is a schematic flowchart showing a method for estimating the state of a secondary battery according to an embodiment of the present disclosure. In FIG. 5, the subject that performs each step may be each component of the previously-described apparatus 1 for estimating the state of a secondary battery according to the present disclosure.

As shown in FIGS. 1 and 5, according to the method for estimating the state of a secondary battery according to the present disclosure, in step S100, the charging unit 100 charges the secondary battery 10.

Subsequently, in step S110, the voltage measuring unit 200 measures the voltage across two terminals of the secondary battery 10.

Subsequently, in step S120, the time measuring unit 300 receives a voltage value of the secondary battery 10, and in a predefined voltage range, measures the charge time of the secondary battery 10 corresponding to the voltage range multiple times during charging of the secondary battery 10.

Subsequently, in step S130, for a first charge time and a second charge time measured sequentially at a time interval, the control unit 400 calculates a ratio of the second charge time to the first charge time, and estimates the state of the secondary battery 10.

Preferably, in step S110, the voltage measuring unit 200 may measure the voltage across the two terminals of the secondary battery 10 when the charge current is continuously supplied from the charging unit 100 to the secondary battery 10.

Preferably, in step S130, the control unit 400 may set the charge time at the product sale of the secondary battery 10 as a first charge time and the charge time measured at a time interval from the first charge time as a second charge time, and calculate a ratio of the second charge time to the first charge time.

Figure 6:
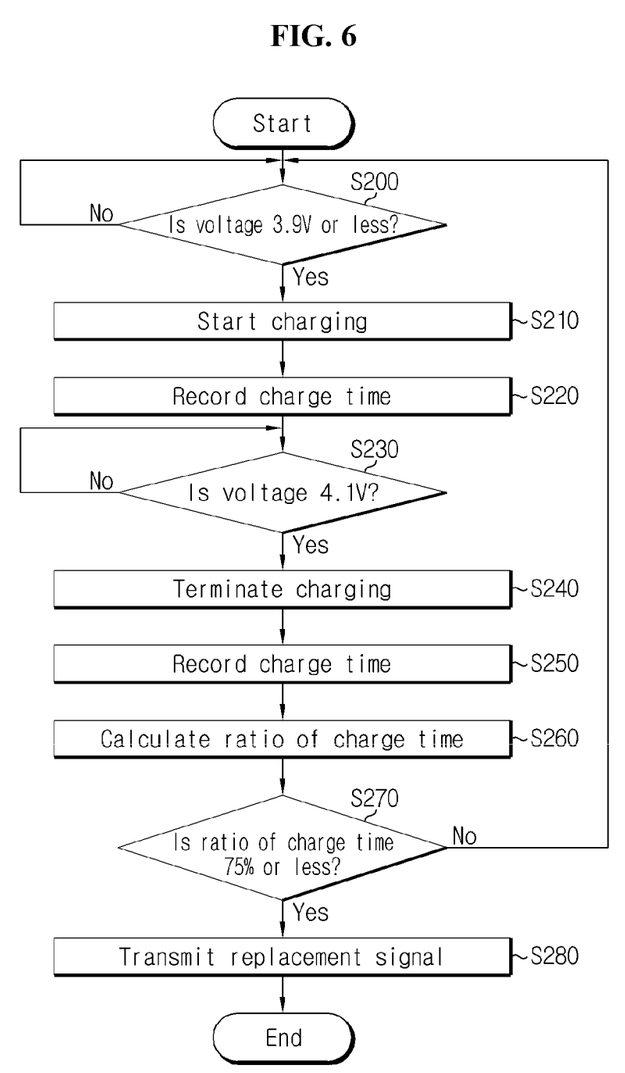
FIG. 6 is a schematic flowchart showing a method for estimating the state of a secondary battery according to another embodiment of the present disclosure.

FIG. 6 is a schematic flowchart showing a method for estimating the state of a secondary battery according to another embodiment of the present disclosure. In FIG. 6, the subject that performs each step may be each component of the previously-described apparatus 1 for estimating the state of a secondary battery according to the present disclosure. Additionally, the charge start voltage (3.9V), the charge end voltage (4.1V) and the predetermined value (75%) for replacement signal transmission shown in FIG. 6 are just an example, and the method for estimating the state of a secondary battery according to an embodiment of the present disclosure is not limited to these values.

As shown in FIGS. 1 and 6, according to the method for estimating the state of a secondary battery according to the present disclosure, in step S200, the control unit 400 may determine whether the voltage of the secondary battery 10 corresponds to a charge start voltage. Here, the charge start voltage may be 3.9V.

When the determination result of the step S200 is YES, the control unit 400 may transmit a charge start command to the charging unit 100 to enable the charging unit 100 to charge the secondary battery 10 in step S210. On the contrary, when the determination result of the step S200 is NO, the control unit 400 may not charge the secondary battery 10.

Subsequently, in step S220, the time measuring unit 300 may record the charge time of the secondary battery 10. Particularly, the time measuring unit 300 may start recording the charge time when the charging starts.

Subsequently, in step S230, the control unit 400 may determine whether the voltage of the secondary battery 10 corresponds to a charge end voltage. Here, the charge end voltage may be 4.1V.

When the determination result of the step S230 is YES, the control unit 400 may transmit a charge end command to the charging unit 100 to enable the charging unit 100 to terminate the charging of the secondary battery 10 in step S240. On the contrary, when the determination result of the step S230 is NO, the control unit 400 may keep charging the secondary battery 10.

Subsequently, in step S250, the time measuring unit 300 may record the charge time of the secondary battery 10. Particularly, the time measuring unit 300 may terminate the recording of the charge time when the charging ends.

Subsequently, in step S260, the control unit 400 may calculate a ratio of charge time. In this instance, the control unit 400 may receive the charge time from the memory unit 500 or the time measuring unit 300.

Subsequently, in step S270, the control unit 400 may determine whether the ratio of charge time corresponds to the time to replace. For example, the control unit 400 may determine that it is time to replace when the ratio of charge time is 75% or less.

When the determination result of the step S270 is YES, the control unit 400 may transmit a replacement signal transmit command to the alarm unit 600 in step S280. Additionally, the alarm unit 600 may transmit a replacement signal based on the command received from the control unit 400. On the contrary, the determination result of the step S270 is NO, the control unit 400 may revert to the step S200 to determine whether the voltage of the secondary battery 10 corresponds to the charge start voltage.

When the control logics are implemented in software, the control unit 400 may be implemented as a set of program modules. In this instance, the program module may be stored in the memory device and executed by the processor.

Additionally, at least one of various control logics of the control unit 400 may be combined, and the combined control logics are not limited to a particular type and include any type that can be written in computer-readable coding systems and read and accessed by the computer. For example, the recording media may include at least one selected from the group consisting of ROM, RAM, register, CD-ROM, magnetic tape, hard disk, floppy disk and an optical data recording device. Additionally, the coding systems may be stored and executed in computers connected via a network in distributed manner. Additionally, functional programs, codes and segments for implementing the combined control logics may be easily inferred by programs in the technical field pertaining to the present disclosure.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Meanwhile, the term 'unit' such as 'memory unit' and 'control unit' is used herein, but this indicates a logical component unit and it is obvious to those skilled in the art that the term does not necessarily indicate a component that may be or should be physically separated from other.

What is claimed is:

1. An apparatus for estimating a state of a secondary battery, comprising:
    a charging unit electrically connected to two terminals of the secondary battery, the charging unit being configured to charge the secondary battery;
    a voltage measuring unit electrically connected to the two terminals of the secondary battery, the voltage measuring unit being configured to measure a voltage across the two terminals of the secondary battery;
    a time measuring unit configured to:
    receive a voltage value of the secondary battery from the voltage measuring unit; and
    during charging of the secondary battery, in a predefined voltage range, measure a charge time of the secondary battery corresponding to the voltage range multiple times; and
    a control unit configured to:
    transmit and receive an electrical signal to/from the charging unit, the voltage measuring unit, and the time measuring unit;
    calculate a ratio of a first charge time and a second charge time measured by the time measuring unit sequentially at a time interval; and
    estimate a state of the secondary battery,
    wherein the voltage range includes:
        a first voltage range in which a constant charge current is maintained, and
        a second voltage range in which a constant charge voltage is maintained, and
    wherein the time measuring unit is further configured to measure the charge time of the secondary battery corresponding to each of the first voltage range and the second voltage range.

2. The apparatus for estimating a state of a secondary battery according to claim 1, wherein the voltage measuring unit is further configured to measure the voltage across the two terminals of the secondary battery when a charge current is continuously supplied from the charging unit to the secondary battery.

3. The apparatus for estimating a state of a secondary battery according to claim 1, further comprising a memory unit configured to pre-store a degradation level of the secondary battery corresponding to the ratio of the second charge time to the first charge time.

4. The apparatus for estimating a state of a secondary battery according to claim 1, further comprising an alarm unit configured to:
    receive an electrical signal from the control unit; and
    transmit an alarm signal including information associated with a degradation level of the secondary battery to an external device based on the signal received from the control unit.

5. The apparatus for estimating a state of a secondary battery according to claim 1, wherein the control unit is further configured to calculate a ratio of:
    a plurality of charge times measured at a time interval in the first voltage range; or
    a plurality of charge times measured at a time interval in the second voltage range.

6. The apparatus for estimating a state of a secondary battery according to claim 1, wherein the control unit is further configured to:
    set a charge time at a point of product sale of the secondary battery as the first charge time;
    set a charge time measured at a time interval from the first charge time as the second charge time; and
    calculate a ratio of the second charge time to the first charge time.

7. The apparatus for estimating a state of a secondary battery according to claim 1, wherein the control unit is further configured to transmit a replacement signal for the secondary battery when a ratio of the second charge time to the first charge time is a predetermined value or less.

8. A battery pack comprising the apparatus for estimating a state of a secondary battery according to claim 1.

9. A method for estimating a state of a secondary battery, the method comprising:
    charging the secondary battery;
    measuring a voltage across two terminals of the secondary battery;
    receiving a voltage value of the secondary battery;
    during charging of the secondary battery, in a predefined voltage range, measuring a charge time of the secondary battery corresponding to the voltage range multiple times; and
    for a first charge time and a second charge time measured sequentially at a time interval:
    calculating a ratio of the second charge time to the first charge time; and
    estimating a state of the secondary battery,
    wherein the voltage range includes:
        a first voltage range in which a constant charge current is maintained, and
        a second voltage range in which a constant charge voltage is maintained, and
    wherein the method further comprises measuring the charge time of the secondary battery corresponding to each of the first voltage range and the second voltage range.

* * * * *